TWO-STATE POWER AMPLIFIER WITH TRANSITIONAL FEEDBACK

Filed Aug. 13, 1964

INVENTOR
NORMAN H. CROWHURST

BY Alexander & Dowell
ATTORNEY

INVENTOR
NORMAN H. CROWHURST

BY Alexander & Dowell
ATTORNEY

INVENTOR
NORMAN H. CROWHURST

BY Alexander & Dowell
ATTORNEY

TWO-STATE POWER AMPLIFIER WITH TRANSITIONAL FEEDBACK

Filed Aug. 13, 1964

INVENTOR

NORMAN H. CROWHURST

BY Alexander & Dowell

ATTORNEY

INVENTOR
NORMAN H. CROWHURST

BY Alexander & Dowell
ATTORNEY

TWO-STATE POWER AMPLIFIER WITH TRANSITIONAL FEEDBACK

Filed Aug. 13, 1964

6 Sheets-Sheet 6

INVENTOR

NORMAN H. CROWHURST

BY Alexander & Dowell

ATTORNEY

United States Patent Office 3,336,538

Patented Aug. 15, 1967

3,336,538

TWO-STATE POWER AMPLIFIER WITH TRANSITIONAL FEEDBACK

Norman H. Crowhurst, Box 651, Gold Beach, Oreg. 97444

Filed Aug. 13, 1964, Ser. No. 389,393
20 Claims. (Cl. 332—9)

ABSTRACT OF THE DISCLOSURE

A solid state amplifier using "on-off" mode power amplifying transistors fed with pulses from a multivibrator through pulse-width modulator means. The amplifier reproduces with good fidelity an input signal, for instance speech, which input signal modulates the amplified pulse widths from substantially zero for zero input amplitude to a maximum width wherein adjacent pulses blend together and produce a constant D.C. output level whenever the input signal reaches the maximum amplitude to which the system is responsive. In order to provide improved fidelity of reproduction, the system includes degenerative feedback across the whole amplifier, a degree of regenerative feedback in the pulse circuits to improve pulse response, and a special degenerative feedback across the pulse width modulator means which makes the pulses being amplified by the "on-off" mode amplifiers trapezoidal for the purpose of making the response smoother at zero crossings and at signal amplitude maxima by having the amplitudes of the pulses as well as their widths change at these extremes.

This invention relates to amplifier systems of the type in which the widths of pulses in a continuous chain of pulses are modulated in accordance with the amplitude of an input signal of lower frequency and then amplified by amplifiers operating in a switching mode, and more particularly this invention relates to improvements in the modulating circuitry for the purpose of improving the efficiency of the amplifier, and improving its linearity at instants when the amplitude of the input signal is very small, or when it is very large and approaching saturation.

This general type of amplifier system has in the past been referred to as a "two-state" amplification system, or as a "Class D" amplifier system, and examples of the general type of system appear in various forms in U.S. Patents 1,874,159; 2,969,506; 2,984,792; 2,990,516; 3,009,112; 3,112,365; and others. This general type of system is especially attractive in connection with amplifying input signals to relatively high power levels using power-amplifying semiconductor components operating between cut-off and saturation in "on-off" switching modes. The prior art points out the particular advantages involved in amplifying signals which have only two amplitude levels, as distinguished from signals having continuously variable amplitude levels. These two-level signals are especially attractive in connection with semi-conductor circuits since the amplification thereof is relatively insensitive to variations in semiconductor characteristics, especally linearity characteristics. Where "on-off" switching mode operation is employed, only the instants of zero crossovers are important, and since the semiconductors are switched from "off" condition to "on" condition almost instantaneously, the internal power dissipation in the semi-conductors is very small. The fact, in turn, makes it possible to use relatively smaller semiconductor ratings to deliver much greater maximum power in a two-level amplifier, than in a conventional amplifier.

This general type of amplification employs a square wave generator, such as a multivibrator, which continuously delivers alternating positive and negative pulses at a fixed frequency which is considerably higher than any input signal frequency to be amplified, and in the absence of an input signal these pulses are symmetrical about a zero axis so that their average value is zero. However, when an input signal is introduced, if its instantaneous value is positive, the pulses in the aforementioned chain on one side of the zero axis are lengthened in duration, and the pulses on the other side of the zero axis are shortened in duration, so that their average value is no longer zero but depends upon the polarity and magnitude of the instantaneous input signal. Conversely, a negative input signal results in shortening of the pulses on said one side of the axis and lengthening of the duration of the pulses on the other side of the zero axis so that the average value moves off of zero in the opposite direction. The peak amplitude of these pulses, however, does not change except in the vicinity of zero input signal conditions as will be explained below, and therefore the power amplifier is normally amplifying pulses of constant height, and therefore the power amplifiers themselves can conveniently be operated in an "on-off"-mode.

In this type of operation, the effieciency is very great because semi-conductors operating in the switching mode have very little internal power dissipation since their internal resistance, except during brief transitional periods is either virtually zero in the full-"on" condition, or effectively infinite in the full-"off" condition. In the past, using ordinary amplifying techniques, maximum efficiency obtainable was only about 75%, but in the two-state amplifier a practical working value of efficiency is about 95%. Moreover, because of smaller internal dissipation, a given semiconductor may safely deliver about five times the maximum power which it could deliver in an ordinary amplifying circuit. Thus, the dynamic range of this type of amplifier can be made greater without increase in distortion, and with excellent stability.

It is a major object of the invention to provide improved pulse-width modulating circuitry in which supersonic high-energy pulses from the multivibrator are first converted into two separate time-interlaced sawtooth waves which are then applied to two different modulator-amplifiers, each driving separate power amplifier paths, one for amplifying the positive components of input signals, and the other for amplifying the negative components thereof. Each amplifier is turned "on" by the steep leading edge of its associated sawtooth, but it is turned "off" when the level of the triangular trailing edge of the sawtooth augmented by any input signal component superposed thereon instantaneously falls below the level required to maintain the power amplifier "on," whereby the time duration of the "on"-condition of the amplifier is a function of the instantaneous input signal level, and the polarity of this input signal determines which of the two power amplifier paths is operative at any particular instant.

The principal advantage of the present pulse-width modulating circuit resides in improved efficiency obtainable with this circuit, particularly with regard to conservation of power under conditions of zero input signal, or small-amplitude input signals. Obviously, the efficiency of power consumption would be poor if, as in prior art circuits, the power transistors deliver the same amount of square-wave carrier power for all input signal amplitudes, as is the case if the only mode of modulation of the carrier pulses is width-modulation in which the positive and negative alternating pulses are of mutually complementary width always adding up to equal a constant amount of power. It is a major purpose of this invention to provide a modulator in which under zero input signal conditions, the modulator passes only very narrow alternating spikes which are easily filtered out. When a substantial input signal of one polarity is applied, these spikes on one side of the zero axis grow to be substantially square pulses of constant (saturation) height and having widths determined by the instantaneous amplitude of the input signal; and the spikes on the other side of the zero axis disappear altogether. The opposite set of spikes, however, will grow when the instantaneous polarity of the input signal reverses.

This type of system works very well except that it introduces certain discontinuities which occur in the vicinity of the zero-axis crossover and/or in the vicinity of maximum input signal amplitudes. There is a practical limitation to the variation of the switching point due to the fact that switching time itself is finite, which necessarily means that a discontinuity exists between the narrowest possible pulse from the pulse-width modulator, and no pulse at all; and this discontinuity shows up as distortion occurring near zero-signal input and saturation signal input, the distortion being especially noticeable for small input signals.

It is another major object of this invention to reduce the distorting effect of this discontinuity, and thereby substantially eliminate the distortion which it introduces, and this improvement is accomplished by employing pulse-amplitude modulation in addition to pulse-width modulation in the vicinity of the extremes of the input signals, namely in the vicinity of the zero-axis input-signal crossings, and/or in the vicinity of the maximum signal amplitude which can be amplified. In this way, at the moment when the pulses approach either zero width, or approach maximum width resulting in a continuous DC level, the narrow pulses, or the narrow space between pulses, changes both in width and in amplitude, rather than suddenly going from maximum amplitude to zero amplitude in an abrupt and discontinuous manner which will introduce appreciable distortion.

It is another major object of this invention to provide several different types of feedback paths in a two-state amplifier, these paths respectively providing: regenerative feedback across the pulse-width modulator to sharpen the pulse response thereof; a separate degenerative feedback path across the whole amplifier system to improve over-all linearity; and a novel, specially-controlled degenerative feedback path operating across the pulse-width modulator to make its output pulse shape slightly trapezoidal so that very narrow pulses will have triangular sides which will cause the amplitude thereof to shrink whenever the width of the pulse approaches zero or approaches continuous DC in the vicinity of saturation, thereby giving the aforementioned amplitude-modulation effect in the vicinity of zero-axis crossover and also in the vicinity of maximum output signal level.

As stated above the degenerative feedback applied across the modulator is limited in magnitude to such an extent that it strongly affects the pulses from the modulator only under zero and small input-signal conditions. In the absence of such feedback the narrow spikes occurring for zero input levels would be the same amplitude as the wider output pulses occurring in response to substantially greater input amplitudes. However, the degenerative feedback has a sizeable effect on these narrow spikes, first shrinking their amplitudes about 50% and then making them essentially triangular in shape for a zero input signal. If then a very small input signal is applied to the modulator, the spikes on one side of the zero axis further shrink and the opposite spikes grow. As the signal amplitude further increases, the former spikes disappear altogether as the latter spikes reach the full amplitude of the pulse output of the modulator, and, upon further increase in input amplitude the latter spikes grow wider and wider until at the maximum useful input amplitude, the output of the modulator is a DC level in which the space between pulses has vanished. In the last stages of disappearing, this space between pulses becomes triangular (spike-shaped) due to the special degenerative feedback and then shrinks upwardly toward the ultimate DC level. Thus, it will be seen that the amount of power consumed by the amplifier system is essentially proportional to the instantaneous input amplitude and is very small for zero and for small input amplitude levels.

It is another important object of this invention to provide a system in which the pulse repetition frequency is more efficiently filtered out because the total amount of carrier power delivered by the power output amplifier to the filter is very small for small input signal amplitudes. To the extent that the filter is imperfect, some of the carrier (pulse) frequency will be delivered to the load as spurious energy, and it is much easier to filter out this energy in the present system where it is small in the vicinity of zero-input signal, than in prior art systems where this energy is as great for zero input as it is for greater input signal levels.

Other objects and advantages of the invention will become apparent during the following discussion of several practical embodiments of the invention, which has been built and succesfully tested. Reference is made to the drawings, wherein.

Figure 1:
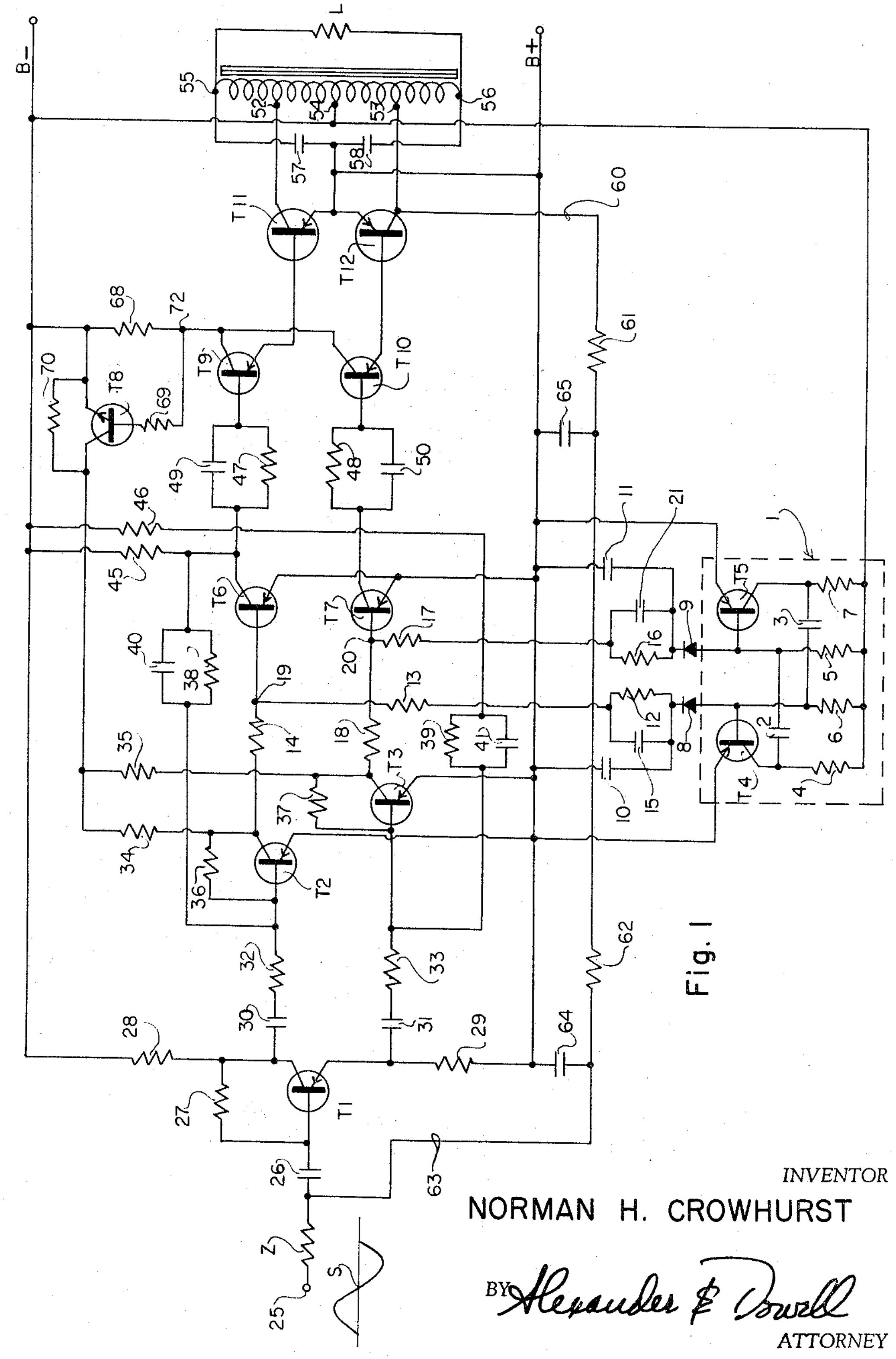
FIG. 1 is a schematic diagram of a preferred embodiment of the present invention.
Figure 4:
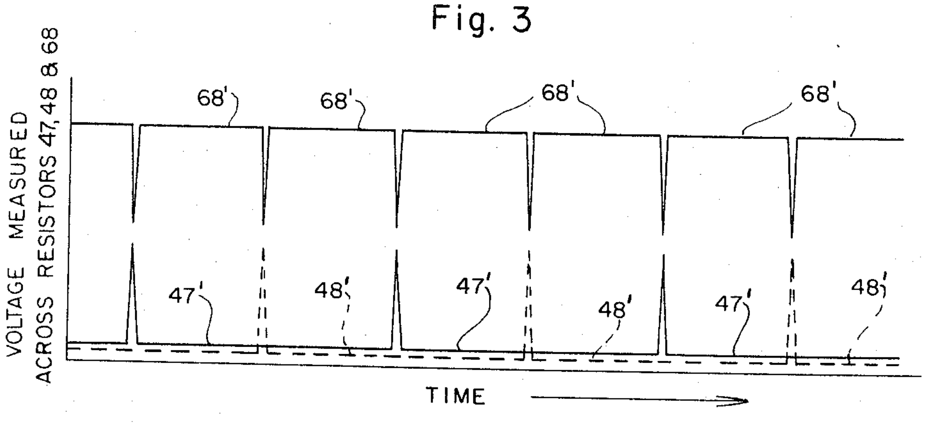
Figure 5:
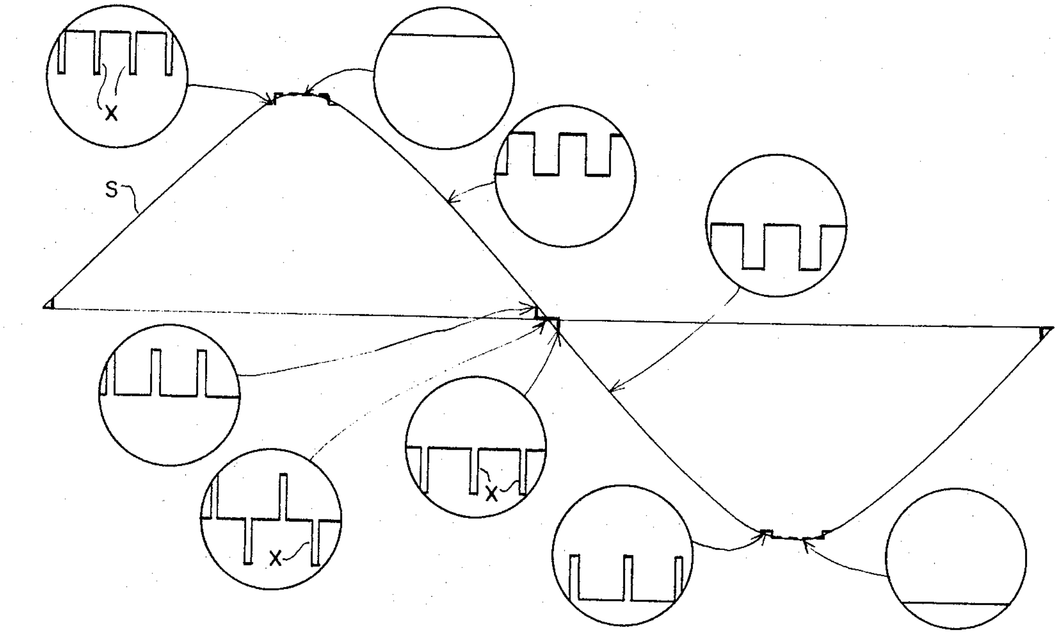
Figure 6:
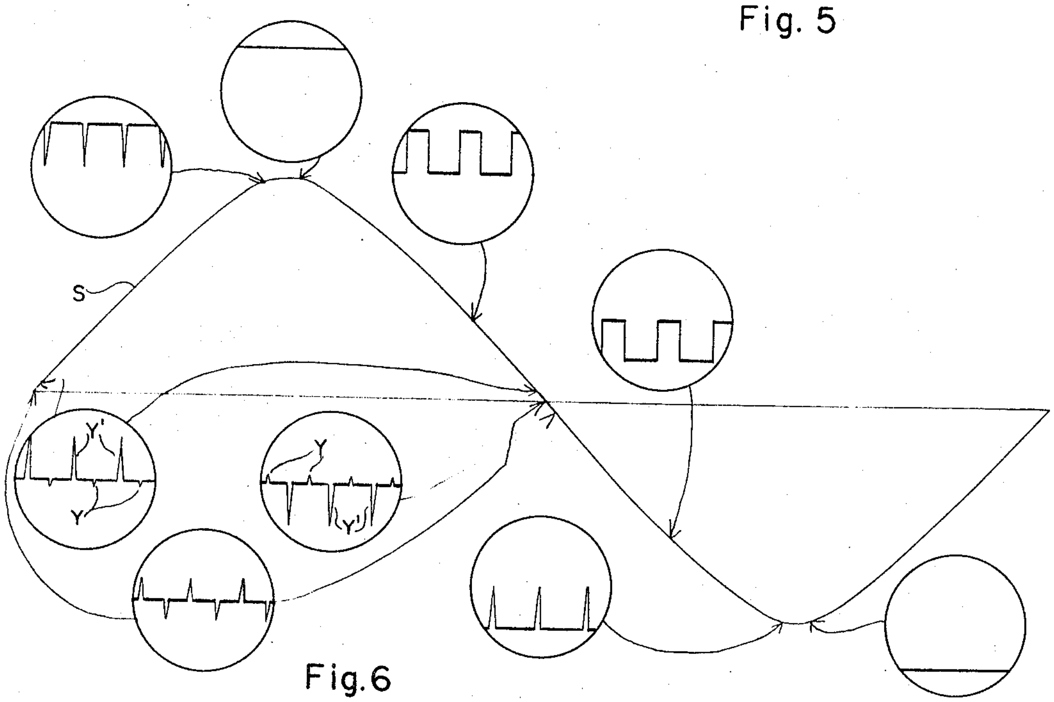
Figure 7:
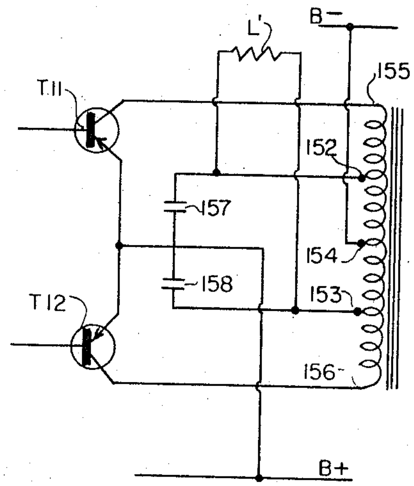
Figure 8:
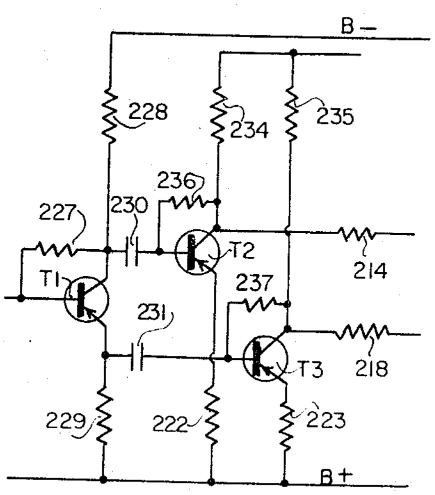
Figure 9:
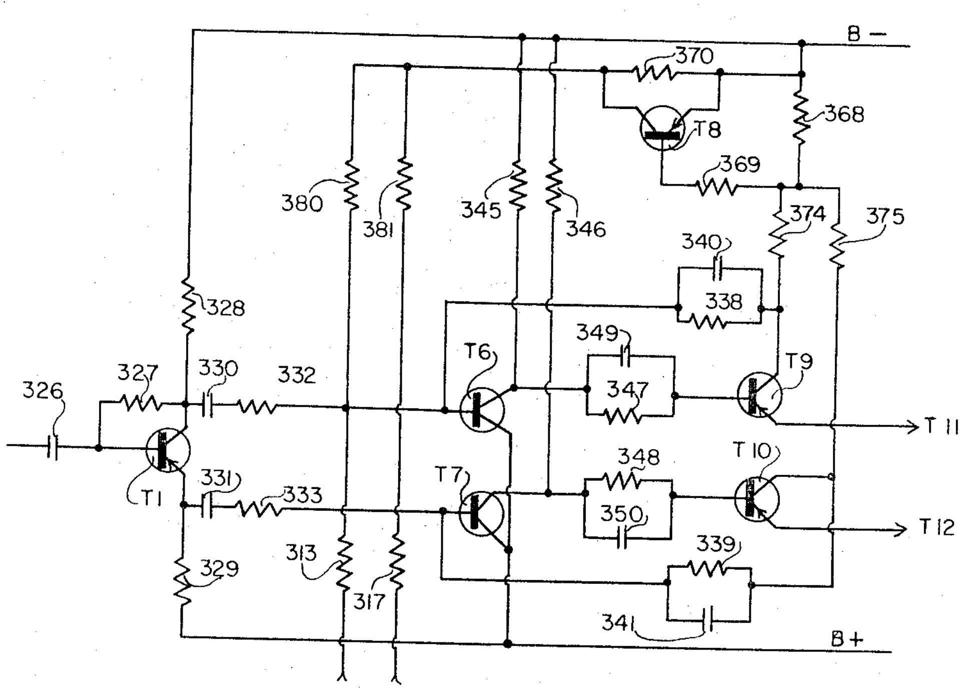
Figure 10:
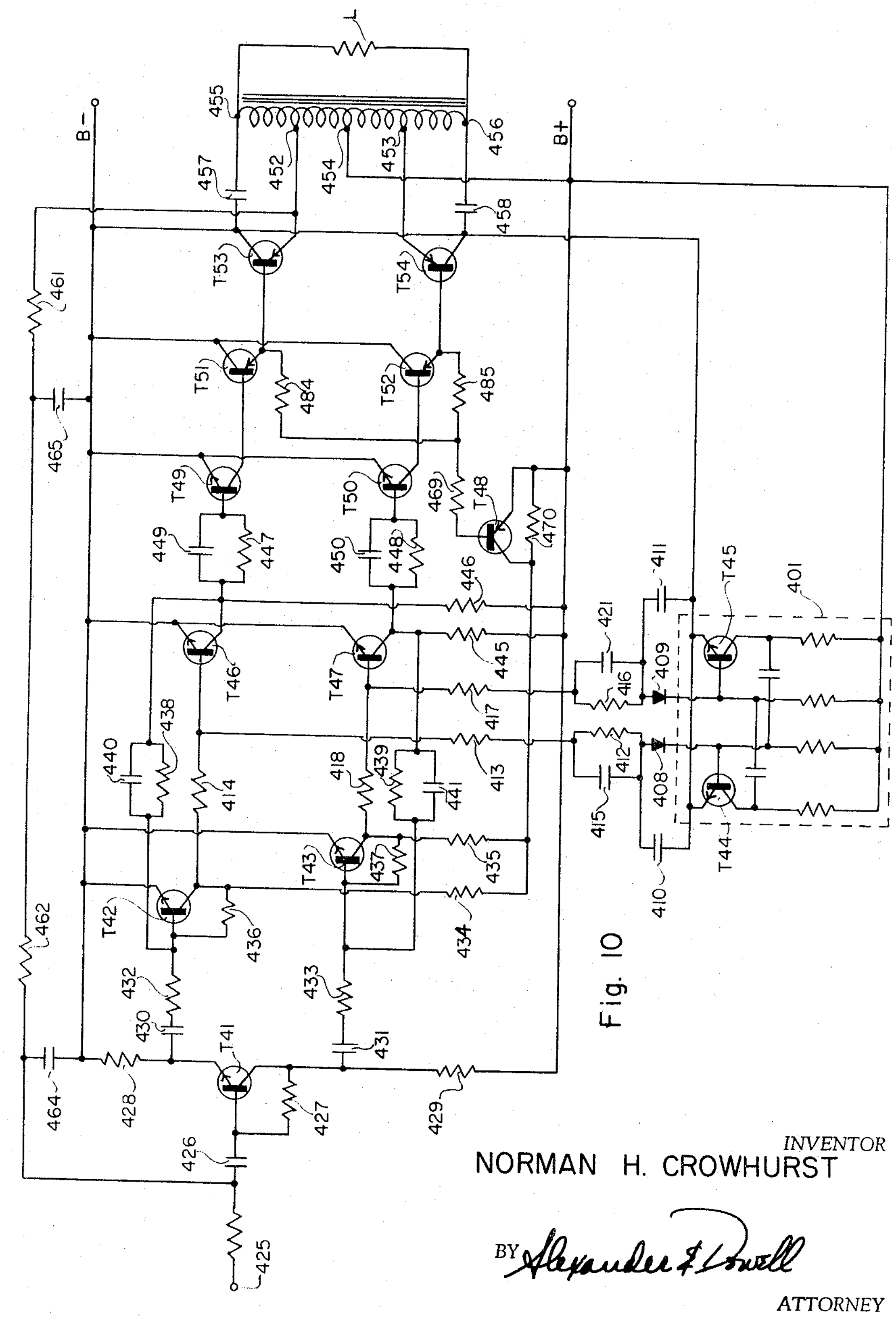
Figure 11:
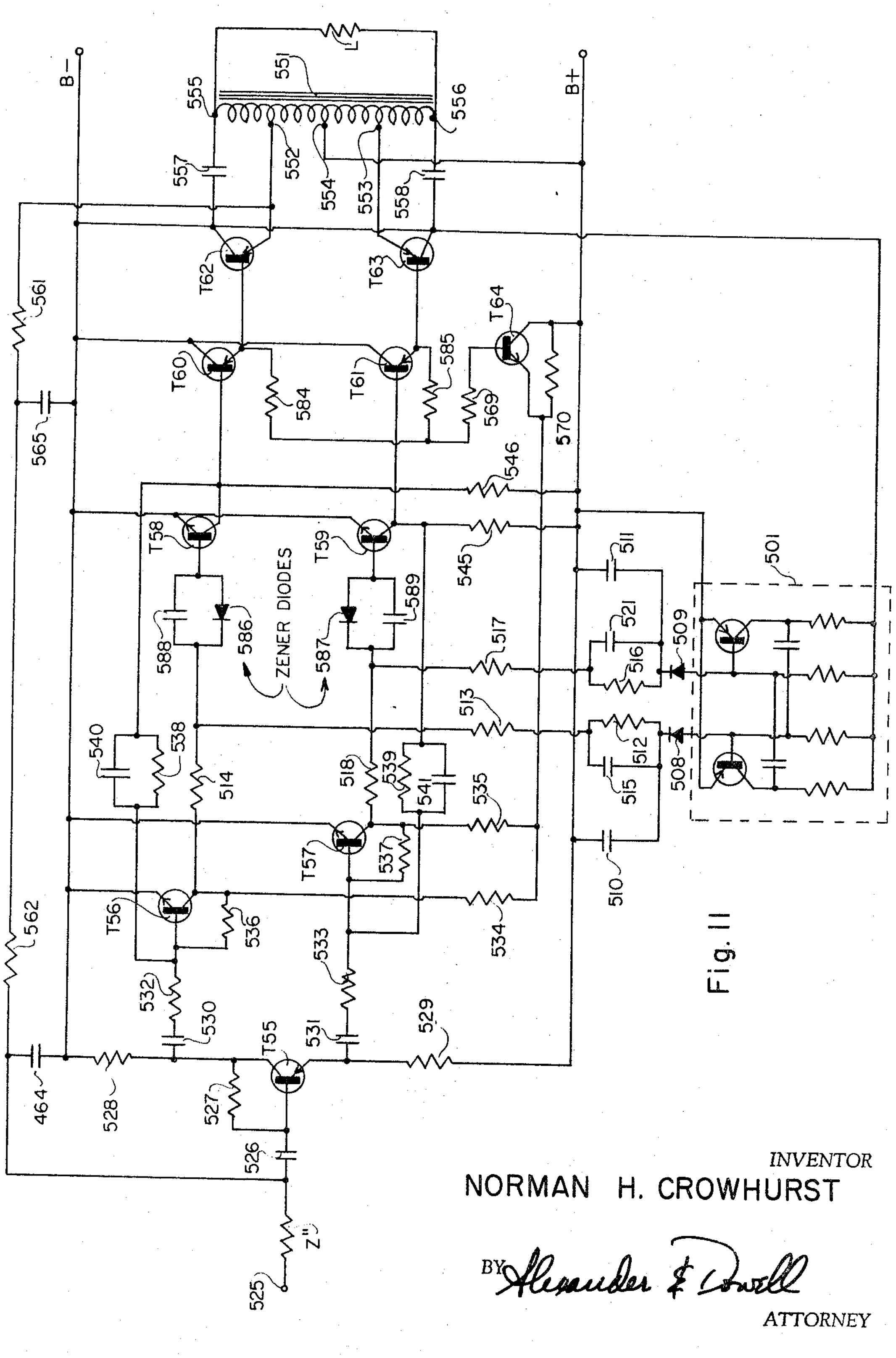

FIG. 4 is a graphical illustration of the effect of the special limited-amplitude negative feedback provided for the purpose of limiting the output of a pulse-width modulator under zero-input-signal conditions to about half its normal output pulse height, and for making such output pulses slightly triangular in shape so that they will be amplitude-modulated by very small input signals at the terminal 25;

FIG. 5 is a graphical illustration showing encircled some typical output waveforms of a modulator system not equipped with the amplitude-controlled negative feedback system according to the present invention;

FIG. 6 is a graphical representation similar to FIG. 5 but showing the effect of the amplitude-controlled negative feedback circuit as applied to signal levels in the vicinity of zero-axis crossover and saturation input signal level;

FIG. 7 is a schematic diagram of a power output stage, modified with respect to the output stage of FIG. 1;

FIG. 8 is a showing of a modification of the input amplifier stages of the system shown in FIG. 1;

FIG. 9 is a schematic diagram illustrating a modified form of pulse-width modulator in which two transistor stages have been eliminated as compared with FIG. 1;

FIG. 10 is a schematic diagram of a considerably modified amplifier system employing NPN transistors except in the power amplifier stage; and FIG. 11 is a further modification similar to FIG. 10 but simplified to omit several transistors employed in the FIG. 10 modification.

Referring now to FIG. 1 of the drawings, this figure shows a preferred working embodiment of the invention including four basic circuit portions:

First, there is an input circuit including the transistor T1 which receives the signal to be amplified and splits it into two opposed phases which are then delivered to linear audio amplifiers including transistors T2 and T3.

Second, the system includes a free-running multivibrator circuit including the transistors T4 and T5 which continuously oscillate at a supersonic rate and thereby deliver a carrier frequency in the form of large energy-content pulses.

Third, the system includes a pulse-width modulator circuit comprising transistors T6 and T7 which receive outputs from the above-mentioned multivibrator, and also receive phase-split components of the input signal which is to be amplified; and these modulator transistors T6 and T7 deliver outputs which drive the fourth circuit portion, namely "on-off" power amplifiers. An amplitude-controlled negative feedback transistor T8 is provided for the novel purpose hereinafter discussed, and this transistor is in a feedback path connected operatively across the pulse-width modulator circuit.

The power amplifier circuit which comprises the fourth circuit portion includes two driver transistors T9 and T10 which are direct-coupled to drive the final power amplifier transistors T11 and T12. The transistors T9, T10, T11 and T12 are all normally cut "off," and these transistors are turned "on" by the modulator outputs at appropriate moments and in such a manner as to drive the power transistors usually to saturation, so that the power transistors operate in a two-state "on-off" switching mode.

Discussing these four circuit portions of the system in further detail, the carrier frequency generator 1 comprises a free-running multivibrator circuit of conventional design in which the capacitors 2 and 3 when considered with the resistors 4, 5, 6, and 7 provide a supersonic time constant in a manner well-known per se. The emitters of the transistors are returned directly to the positive supply labeled B+ and the collectors of the transistors are returned through the resistances 4 and 7 to the other side of the power supply labeled B−. The resistors 5 and 6 supply a small forward bias to the bases of the transistors and from which the above-mentioned large energy-content pulses are taken through diodes 8 and 9, which alternately supply positive pulses to charge capacitors 10 and 11. The charge on the capacitor 10 produced by any particular pulse from the multivibrator leaks off along an approximately sawtooth waveform shown in FIG. 2 and labeled 10′, this charge passing through the resistor 12 and upwardly through the resistor 13. Bias current supplied through the resistor 14 renders the transistor T6 conductive most of the time, but when the sawtooth current through the resistor 13 exceeds this bias in the resistor 14, transistor T6 is cut "off." The capacitor 15 merely serves to make the leading edge of the sawtooth wave 13′ sharper as shown in FIG. 3, and in a manner well-known in the pulse handling art. Likewise, on alternate half cycles of the multivibrator 1, the capacitor 11 is charged positively and this charge leaks off along the curve labeled 11′ in FIG. 2 to produce another approximately sawtooth waveform interlaced in time with the waveform 10′. This charge leaks through the resistance 16, and through the resistance 17 to oppose the forward bias supplied the transistor T7 through the resistance 18. The capacitor 21 serves a purpose similar to the capacitor 15. Thus, alternate positive sawtooth waves are applied to the transistors T6 and T7 at the points labeled 19 and 20, for the purpose to be explained more fully hereinafter.

The input signal to be amplified in the present system is applied at an input terminal 25, FIG. 1, and for illustrative purposes it will be assumed that the input waveform is a sine wave. An impedance Z is illustrated to represent the internal impedance of the source of the input signal S. This input signal passes through a capacitor 26 and is applied to the base of the transistor T1 which is forward-biased by the resistor 27 in a manner well-known per se. The output impedance of the transistor T1 is equally divided between the collector circuit and the emitter circuit, and takes the form of equal load resistances 28 and 29, so that the output of the transistor T1 is in the same form as the input signal S, but includes two oppositely phased signals which are passed through the capacitors 30 and 31 and through the resistors 32 and 33 to the bases of the transistors T2 and T3. These transistors amplify the phase-split components of the input signal and deliver outputs respectively through the resistances 14 and 18 to the bases of the modulator transistors T6 and T7. The transistors T2 and T6 are direct-coupled, as is also the case with the transistors T3 and T7, and the load resistances 34 and 35 of the transistors T2 and T3 when taken with the resistors 14 and 18 form voltage-divider chains which are so proportioned as to maintain the transistors T6 and T7 fully saturated and conductive in the absence of any input signals, whether signals from the terminal 25 or pulses from the multivibrator 1. Thus, since these are PNP transistors, a positive signal at point as to render transistors T6 and T7 fully conductive, and since these are PNP transistors, a positive signal at point 19 or 20 tends to turn the corresponding transistor "off."

Figure 2:
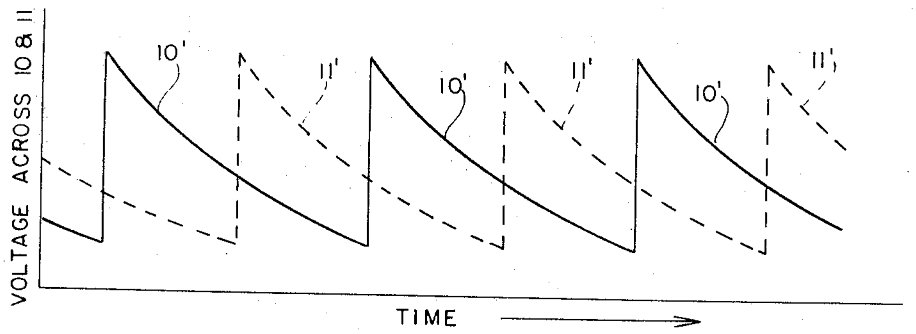
FIG. 2 is a graphical illustration of the interlaced sawtooth waves applied through coupling resistors to the pulse-width modulators shown in the schematic diagrams.
Figure 3:
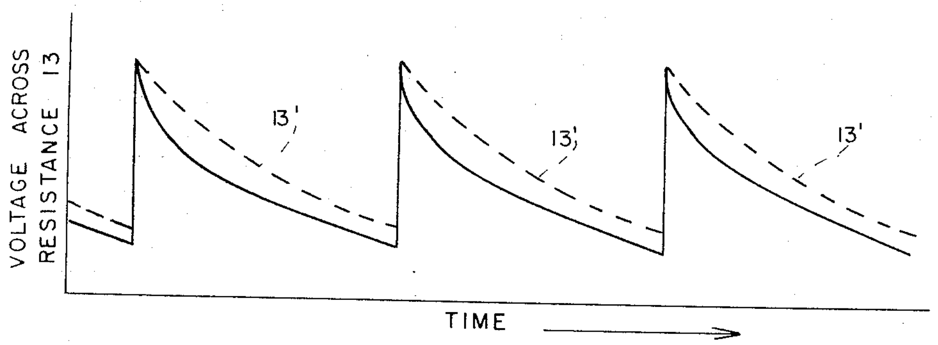
FIG. 3 is a graphical illustration showing an improvement which can be made in the sawtooth waves applied to the width modulators.

On alternate half cycles of the multivibrator 1, large positive sawtooth voltages are applied with steep leading edges to points 19 and 20, respectively, as shown in FIG. 2 in connection with the illustrated waves 10′ and 11′. The transistor T6 is momentarily cut "off" by the leading edge of the sawtooth wave 10′, but in the absence of an input signal, this charge leaks off from the capacitor 10 and soon falls below a sufficient level to overcome the forward bias on the transistor T6 thus allowing it to regain conductivity after only a brief "off" interval. The same sequence occurs on opposite half cycles of the multivibrator 1 with respect to the transistor T7 which is briefly cut "off" by the sharp positive leading edge of the sawtooth wave 11′, which charge leaks off from the capacitor 11 through the resistance 16, permitting the transistor T7 to regain conductivity after only a brief "off" interval, assuming no input signal to the terminal 25.

It should be briefly stated here that the power amplifiers T9 and T11, and T10 and T12, are normally con-conductive when the modulator transistors T6 and T7 are (normally) conductive. Therefore, during the "off" intervals of the modulators, the power amplifiers are switched to "on" condition to thereby deliver an output to the load L. This will be further discussed below.

Returning to the discussion of transistor T6, as stated above after the leading edge of the sawtooth 10′ cuts "off" the transistor T6 it will return to conductive state after only a little of the charge has leaked from capacitor 10, and during the "off" interval it progressively becomes easier for the transistor T6 to regain conductivity as the sawtooth decays through the resistor 13 and the resistor 14. Although the resistance values are so proportioned that the transistor T6 would normally regain conductivity by the time the sawtooth wave has decayed slightly, there may also be applied to the point 19 an amplified component of the input signal S. If the momentary value of the signal S is positive at the input terminal 25, the signal at the capacitor 30 will be negative, but the signal at the resistor 14 will be positive. This positive component at resistor 14 is supplied to the transistor T6 so as to augment the positive sawtooth, and thus increase the duration of the transistor "off" time by driving it further beyond cut-off. At maximum positive input signal the combined signal component and the sawtooth component will prevent it from regaining conductivity at all during the decay of the sawtooth, thus producing an output of maximum duration to the load by the power transistors T9 and T11. On the other hand, the oppositely-phased component of the input signal S applied through the transistor T3 and the resistance 18 will be negative in value at the resistor 18 and will therefore buck the positive sawtooth current applied at the point 20 through the resistance 17. Since the positive sawooth 11′ at point 20 is barely able to cut "off" transistor T7, even a small negative signal component at point 20 will tend to overcome the sawtooth current and allow the transistor T7 to remain conductive. Thus, little or no output to the load L will be delivered by the power transistors T10 and T12 which will remain "off" when the transistor T7 remains "on." A very small negative signal component applied through the resistor 18 may not quite overcome the positive sawtooth applied to the transistor T7, but a slightly larger negative signal component will overcome it entirely. Thus, when a positive signal is applied to input terminal 25, transistor T6 drives power amplifiers T9 and T11 to deliver an output pulse whose duration depends on the amplitude of the input signal, but the oppositely-phased component of input signal bucks the sawtooth applied to transistor T7 and prevents it from cutting off T7 at all if the input is more than very small in amplitude. In general, an input to terminal 25 of positive value turns "on" the power amplifiers T9 and T11, and maintains amplifiers T10 and T12 "off." Conversely, a negative input to terminal 25 turns "on" power amplifiers T10 and T12, but maintains T9 and T11 "off." With zero-signal input T9 and T11 conduct very briefly at the peaks of the sawteeth 10′, and T10 and T12 conduct very briefly at the peaks of sawteeth 11′. A very small positive input shrinks the output from T10 and T12 and widens the interval of conductivity of T9 and T11 proportionately. As the input amplitude increases, the former shrinks more and approaches zero, while the latter grows, approaching continuous conduction for saturation level positive input signals. The opposite conductivity conditions occur when a negative signal is applied to the input terminal 25. A small amount of regenerative feedback is provided through the resistances 38 and 39 for the purpose of sharpening the response of the transistors T6 and T7 to input signals so as to provide very rapid and steep-acting characteristics. The capacitors 40 and 41 further sharpen this action in a manner well-known per se.

The modulator transistors T6 and T7 are provided respectively with load resistors 45 and 46, and since the transistors T6 and T7 are normally conductive their normal output level is positive at the collectors and this positive signal is directly applied through the resistors 47 and 48 to the bases of the driver transistors T9 and T10. Capacitors 49 and 50 sharpen the response to the outputs from transistors T6 and T7.

The transistors T9 and T10 are directly connected to the transistors T11 and T12, respectively, as emitter follower stages for driving these power transistors. The fact that the transistors T6 and T7 are normally conductive and therefore normally deliver a positive output maintains the PNP transistors T9, T10, T11 and T12 nonconductive. On the other hand, when one of the transistors T6 or T7 is driven "off" by one of the sawtooth waves 10′ or 11′ the collector of that modulator transistor goes sharply negative and pulses the associated drive and power transistor to saturation. Thus, when the transistor T6 is "on," the transistors T9 and T11 are "off," and vice versa. This same statement is also true of transistor T7, and of its control action as applied to the transistors T10 and T12.

The collectors of the power transistors T11 and T12 are connected in push-pull to taps 52 and 53 of output transformer 51 having a center tap 54 connected with the B-supply. The load is taken off across the outermost terminals 55 and 56, and in the illustrative practical working embodiment including circuit components tabulated below, the windings are such as to drive a load L of 16 ohms. The leakage inductance of the winding of the transformer taken with the capacitors 57 and 58 produces an LC filter which is tuned to eliminate the supersonic carrier frequency generated by the multivibrator 1 and smooth the output load to regain a waveform similar to the input waveform at terminal 25 but greatly amplified. A quantity of negative feedback is applied from the power transistor stage output through the wire 60, the resistances 61 and 62, and the wire 63 in order to improve the linearity of the amplifier system's response, the capacitors 64 and 65 serving further to filter out any remaining supersonic carrier frequency.

The transformer connections for a load L impedance greater than the transistor impedance is shown in FIG. 1, but where the load L′ has an impedance less than that of the transistors, the circuit of FIG. 7 should be used in which the transistors T11 and T12 have their collectors connected to the ends 155 and 156 of the transformer 151 winding, and the supply-power is fed into the center tap 152 while the load L′ is connected across intermediate taps 152 and 153. The filter capacitors 157 and 158 are still across the load L′ but must be of greater capacity since the winding has less inductance. It is, of course, not necessary that the transformers 51 and 151 be autotransformers.

As mentioned above, with zero input signal S at terminal 25 the modulators T6 and T7 deliver very narrow alternate pulses to turn on the power amplifiers. Without a special degenerative feedback circuit, a small input signal would cause one polarity of these pulses to disappear, and there would always be an abrupt transition from a narrow pulse to no pulse at all, which would result in a discontinuity occurring each time the input signal crossed its zero axis. The present invention provides novel means for eliminating this discontinuity by making these alternate positive and negative pulses, when they become very narrow in width, shrink also in amplitudes as well as pulse-width in the vicinity of zero-axis crossings of the input wave. This is accomplished by providing a special feedback circuit which includes the transistor T8, and the resistors 68, 69 and 70. The resistor 70 is connected in series between the B− supply and the load resistors 34 and 35 of the input signal amplifiers T2 and T3. When the transistor T8 is nonconductive the resistor 70 in series with the load resistors 34 and 35 somewhat reduces the flow of current through them.

When transistor T8 is fully conductive, however, resistor 70 is effectively shorted, thus increasing the forward bias of transistors T6 and T7. If T8 is less than fully conductive, then there will be only a partial increase in forward bias of transistors T6 and T7. The collectors of the transistors T9 and T10 are substantially directly returned to the B− supply through the small resistor 68 so that they are connected in common-collector-configurations. These transistors are normally "off," and therefore no voltage appears across the resistance 68 inserted in series with these collectors. However, when one of the transistors T9 or T10 is suddenly rendered conductive by negative pulses 47′ or 48′, FIG. 4, applied through resistor 47 or 48 as a result of the associated modulator transistor T6 or T7 being turned "off," a positive pulse of voltage 68′, as shown in FIG. 4, is developed at point 72, and coupled through the limiting resistance 69 to the base of NPN transistor T8, thereby pulsing it partially conductive and partially short-circuiting the resistance 70 for the duration of the pulse 68′. Accordingly, the voltage drop which had been introduced in series with the load resistors 34 and 35 by resistor 70 disappears, thereby rendering these resistors more negative, which places degenerative feedback on the inputs to the two normally "on" modulator transistors T6 and T7, bucking the positive sawtooth waves applied thereto and turning them back "on" sooner, so as to reduce their output signals and thereby turning "off" the power amplifiers sooner. The amount of feedback is limited by the size of the voltage drop across resistor 70 when transistor T8 is cut "off," and the magnitude of resistor 70 therefore determines the maximum magnitude of the thus controlled negative feedback, and the amount of negative feedback determines how much the narrow pulses from the power amplifier are reduced in amplitude as compared with wider output pulses from the power amplifiers.

For small signal inputs the duration for which the sawtooth pulses transistor T6 or T7 "off" varies and thus causes the magnitude of negative feedback through resistor 69 and transistor T8 to change the voltage dropped across resistor 70 varies. As pulses are increased in the one polarity the feedback increases until, at approximately the point where output pulse reaches full saturation amplitude, resistor 70 is completely short-circuited by transistor T8. In the other polarity, at the same point in the signal waveform, the transmitted pulse reaches zero amplitude, transistor T8 does not conduct at all during the equivalent pulse period, and resistor 70 develops its maximum voltage drop for that moment.

Referring now to FIGS. 5 and 6, FIG. 5 shows the operation of the present amplifier system without the negative feedback provided by the transistor T8 and the resistors 68, 69 and 70; whereas the diagram of FIG. 6 shows the operation of the system when this negative feedback is present. The circled waveforms represent the unfiltered output of the system for the various input signal amplitudes indicated. By comparison of the two diagrams, it can be seen that this negative feedback provides amplitude modulation of the pulses occurring at the instants of extreme input signal levels, i.e., either near the operation of an amplifier system which is strictly two-state, meaning that if a pulse X is present in the output at all, it is of full amplitude, but by contrast FIG. 6 shows how, by making the pulse trapezoidal, a spike Y is made triangular so that it diminishes gradually in amplitude just before it disappears altogether in the present novel system. FIG. 6 also shows the manner in which the triangular spiked pulses Y diminish in magnitude on one side of the zero-axis and increase in magnitude as at Y' on the other side of the zero-axis, until the diminishing spikes disappear completely and the increasing spikes turn into full square waves which, although still slightly triangular on their sides, do not visibly show it.

FIG. 8 shows a modification of the input stages preceding the modulators. Parts in FIG. 8 which are similar to those in FIG. 1 bear similar reference numerals, but with a prefix 200 added to the reference numerals. The phase-splitter transistor T1 is shown in FIG. 8 as having respective collector and emitter load resistors 228 and 229 delivering outputs through capacitors 230 and 231. In FIG. 1, there are two series-connected resistors 32 and 33 which are inserted for the purpose of providing the same effective input impedance to transistors T2 and T3 as the load impedances 228 and 229 of the phase-splitter T1. In FIG. 8, there are no resistors corresponding with resistors 32 and 33 of FIG. 1, but instead resistors 222 and 223 are inserted in the emitters of the amplifiers T2 and T3 to increase the input impedances to these amplifiers T2 and T3, and since they are not bypassed, they provide a certain amount of degenerative feedback which helps to maintain the linearity of the amplifier stages. This is a workable alternative, although the circuit shown in FIG. 1 is believed to be preferable in view of the fact that the resistors 32 and 33 are themselves more linear than the inputs to the transistors T2 and T3 in FIG. 8. Moreover, the circuit in FIG. 8 requires more precise biasing of the transistors in order to maintain satisfactory linearity. It is another advantage of the circuit of FIG. 1 that the presence of the resistors 32 and 33 provides isolation of the feedback pulses presented through resistances 38 and 39. In other words, the resistors 32 and 33 reduce the tendency of the feedback pulses through the resistor 39 to be applied to the base of transistor T2, and the tendency of the pulses fed back through the resistor 38 to find their way to the base of transistor T3.

FIG. 9 shows still another modification of the system of FIG. 1 which has been simplified by the omission of transistors T2 and T3, the modified circuit being suitable where less overall gain is required. The modification of FIG. 9 has had the prefix 300 placed before each reference numeral which designates a part performing similarly as it performed in FIG. 1. Transistor T1 is still a phase-splitter providing oppositely-phased signals which are delivered through blocking capacitors 330 and 331 to the transistors T6 and T7, the transistors T2 and T3 having been eliminated. In the circuit shown in FIG. 1, the transistors T2 and T3 and their load resistances 34 and 35 provided the necessary bias levels on the bases of the transistors T6 and T7 in order to maintain them normally-conductive. Since the blocking capacitors 330 and 331 isolate the bases of the transistors T6 and T7 in FIG. 9, forward-bias resistors 380 and 381 provide the sole control of current fed to the bases of the transistors T6 and T7 in the absence of the sawtooth. While the resistors 34 and 35 of FIG. 1 must carry both bias current for T6 and T7 and collector current for T2 and T3, in FIG. 9 resistors 380 and 381 carry only the bias current for T6 and T7, thus giving more precise control. The driver transistors T9 and T10 have been provided with additional and separate load resistors 374 and 375, and positive feedback is taken from the junctions of the collectors of T9 and T10 with these load resistors. Thus, two transistor stages can be saved where total gain need not be as great, without, however, changing the mode of operation of the amplifier and modulator circuits.

FIG. 10 represents a more extensive modification of the system for the purpose of showing how NPN transistors can be used in connection with the low-level amplifier, and the modulating stages, although PNP transistors are still illustrated for the final power amplifier and driver stages. Reference numerals which designate parts performing functions which are analogous to the functions performed by parts shown in FIG. 1 are provided with similar reference numerals but with the prefix 400 added before each of the numerals. The input stage T41 is an NPN transistor which still performs a phase-splitting function so as to deliver oppositely-phased signal components through the capacitors 430 and 431 to the amplifier transistors T42 and T43. These transistors are provided with load resistances 434 and 435 which deliver outputs through the resistors 414 and 418 to the bases of modulator transistors T46 and T47. The resistors 434 and 435 also provide the normal saturation bias to the bases of the modulators T46 and T47. In the system shown in FIG. 10, the multivibrator 401 delivers negative interlaced sawtooth waves through diodes 408 and 409 and resistances 413 and 417. The normally-"on" transistors T46 and T47 are shut "off" by these negative sawteeth, and thereby bias the normally "off" transistors T49 and T50 "on." Whenever either transistors T49 and T50 is turned "on" it will bias the associated driver transistor T51 or T52 also "on," the transistors T49 and T50 being directly coupled to the complementary transistors T51 and T52, the former being NPN transistors and the latter being PNP transistors. The transistors T51 and T52 serve as current amplifiers to provide sufficient drive to the bases of the transistors T53 and T54, which are coupled to the output transformer 451 by an emitter-coupled circuit, as distinguished from the collector-coupled circuit shown in FIG. 1. The resistors 484 and 485 are coupled with the emitters of the transistors T51 and T52 in a circuit which is analogous to that shown in FIG. 9 in order to drive the controlled-amplitude negative-feedback transistor T48 for the purpose of providing the novel amplitude modulation of the pulse waveform in the vicinity of the zero-axis crossovers of the input signal S, and in the vicinity of maximum amplitudes of the input signal S, in a manner analogous to that described in connection with FIG. 1.

FIG. 11 shows a further modified combination of NPN transistors in the input and modulating stages, the present modification being especially useful where less overall gain is required since this circuit omits some of the transistors appearing in FIG. 10. In particular, this modification omits transistors T46 and T47 which appeared in FIG. 10 and uses the equivalent of the transistors T49 and T50 as pulse-width modulators. Parts shown in the diagram of FIG. 11 which are analogous in function to parts shown in FIG. 1 bear similar reference characters except for the addition of the prefix 500 to each reference numeral.

In the embodiment shown in FIG. 11 the multivibrator output is coupled by diodes 508 and 509 which are faced in the same direction as the diodes 8 and 9 in FIG. 1, and in a direction which is opposite to the diodes 408 and 409 in FIG. 10. As a result, the sawtooth waves delivered to the resistances 513 and 517 are positive as in FIG. 1 rather than negative as in FIG. 10. The transistors T58 and T59 serve as the combining stage for the sawtooth waves applied through the resistances 513 and 517, and for the signal components applied through the resistances 514 and 518. These input signals are 180° out-of-phase with each other because of the fact that the principal input signal delivered to the input terminal 525 through the impedance Z″ (representing the source impedance) is split in phase by the transistor T55 and then the two differently phased components are further amplified by the transistor T56 and T57 before delivery to the normally "off" modulator transistors T58 and T59. It is to be noted that Zener diodes 586 and 587 have been inserted in the modulated input signal circuit and bypassed by capacitors 588 and 589. If the Zener diodes were not present, the transistors would tend to become conductive when a small positive potential was applied to their bases, but by insertion of the Zener diodes, the conductivity point is moved to require an amplitude near the peak of the sawtooth wave to turn the modulators T58 and T59 on. As compared with FIG. 1, transistor T55 corresponds with transistor T1, and transistors T56 and T57 correspond with transistors T2 and T3. However, transistors T56 and T57 are NPN, rather than PNP as in the case of transistors T2 and T3. Therefore, the output signals to the resistors 514 and 518 are reversed for the same polarity input when compared with the output polarities of transistors T2 and T3 in FIG. 1.

The modulator transistors T58 and T59 are normally non-conductive, and are pulsed "on" when the sawtooth wave reaches a positive peak. When the NPN transistors T58 and T59 are "off," so are the driver and power transistors T60, T61, T62 and T63. When a sawtooth wave approaches its maximum positive peak, a Zener diode 585 or 587 is overcome and a corresponding transistor T58 or T59 is turned "on," which in turn turns "on" the associated driver and power transistors. The positive current through the Zener diode into the modulator transistor's base attributable to a sawtooth wave soon ceases flowing as the sawtooth decays below a sufficient level to break down the Zener diode. In the absence of an input signal to input terminal 525, this occurs rather quickly since only the peak of the sawtooth wave is sufficient to break down the Zener diode. However, the duration of the positive current flowing into the base of the modulator transistor is increased by an input signal at the terminal 525 which supplies an additional positive boost in the current to the base of the modulator transistor through the Zener diode. As in the previous circuits, the signal output from amplifier T56 is oppositely-phased with respect to the output signal from T57. Therefore, the signal component to one of the modulator transistors is positive and will hold it conductive longer than would be the case in the absence of a signal, thereby duration-modulating the pulse-width from that modulator; but the signal output from the other amplifier will be negative and will overcome the positive current attributable to the sawtooth at the base of the other modulator transistor, and, in the presence of an input signal of substantial amplitude, will prevent the second modulator transistor from becoming conductive at all.

In FIG. 11, the amplitude-modulating negative feedback stage T64 is coupled through resistor 569 to resistors 584 and 585 which are controlled by the emitter potentials of the driver transistors T60 and T61. Since NPN transistors are used in the stages T56 and T57, the resistance 570 is connected to the B+ supply and in series with the collector load resistors 534 and 535, but the function of the amplitude modulating transistor T64 is substantially the same as the function attributable to transistor T48 in FIG. 10, and T8 in FIG. 1.

The following values when inserted in the FIG. 1 embodiment comprise a satisfactory working example of the invention using a 12 volt D.C. supply.

| Resistances: | Ohms |
|---|---|
| 27 | 220,000 |
| 36, 37 | 22,000 |
| 32, 33 | 680 |
| 5, 6, 14, 18, 12, 16, 28, 29 | 1,000 |
| 62 | 68,000 |
| 61, 69 | 3,300 |
| 34, 35 | 330 |
| 13, 17 | 2,200 |
| 4, 7, 70 | 100 |
| 38, 39 | 75,000 |
| 45, 46 | 150 |
| 68 | 75 |
| 47, 48 | 120 |

| Capacitors: | | |
|---|---|---|
| 26 | microfarads | 6 |
| 30, 31 | do | 2 |
| 64 | do | .001 |
| 65 | do | .025 |
| 40, 41 | micromicrofarads | 68 |
| 49, 50 | microfarads | .1 |
| 10, 11 | do | .01 |
| 15, 21 | do | .0033 |
| 2, 3 | do | .05 |
| 57, 58 | do | 10 |

| Transistors: | |
|---|---|
| T1, T6, T7 | 2N323 |
| T2, T3, T4, T5 | 2N395 |
| T9, T10 | 2N524 |
| T11, T12 | 2N1046 |
| T8 | 2N388 |
| Diodes | All 1N283 |
| Output transformer | Quality W77 |

There are many other variations of the present invention, which have not been specifically illustrated, it being possible to substitute different types of transistors and to use various other amplifier circuits to accomplish the amplifying functions. The present invention is not to be limited by the illustrative embodiments, nor to amplifiers per se, but can be used as D.C. to A.C. inverters and in other switching applications within the scope of the following claims.

I claim:

1. In an amplifier system including "on-off" power amplifier means, a continuously operating source of pulses, means for receiving an input signal to be amplified, and a modulator connected to receive the pulses and the input signal and to key the power amplifier means "on" normally to saturation at the beginning of a pulse and to key it "off" after an interval of time which depends upon the instantaneous input signal amplitude to provide output pulses which approach zero width for zero input signals and approach a constant saturation level for the maximum input signal to which the system is responsive, the system being improved to provide a smoother response in the vicinity of zero and maximum input signals, the improvement comprising:

(a) inverse feedback means connected operatively across the modulator to feedback a transient signal each time the power amplifier means is keyed, the signal opposing the direction of keying; and (b) means to limit said transient feedback signal so that its amplitude changes substantially only during keying "on" and keying "off" of the power amplifier means thereby to provide pulses at the output of the modulator having slightly convergent leading and trailing edges so that the pulses will become triangular and their effective amplitudes will change when their widths approach zero and maximum.

2. In an electronic system including "on-off" power amplifier means, a continuously operating source of trigger pulses, means for receiving an input analog signal, and a modulator connected to receive the pulses and the analog signal and to key the power amplifier means "on" normally to saturation at the beginning of a trigger pulse and to key it "off" after an interval of time which depends upon the instantaneous analog signal amplitude, the improvement comprising:

pulse shaping means connected to shape each output pulse of the modulator to provide a trapezoidal pulse to key the power amplifier means, which pulse has its leading and trailing edges sloped convergently toward each other to the full height of the pulse whereby as a trapezoidal pulse approaches zero width, or a maximum width where it merges with adjacent pulses, it will become triangular and the effective amplitude of the sides of the pulse will decrease.

3. In an amplifier system including "on-off" power amplifier means, a continuously operating source of pulses, means for receiving an input signal to be amplified, and a modulator connected to receive the pulses and the input signal and to key the power amplifier means "on" normally to saturation at the beginning of a pulse and to key it "off" after an interval of time which depends upon the instantaneous input signal amplitude to provide output pulses which approach zero width for zero input signals and approach a constant saturation level for the maximum input signal to which the system is responsive, the system being improved to provide a smoother response in the vicinity of zero and maximum input signals, the improvement comprising:

(a) inverse feedback means connected operatively across the modulator to feedback a transient signal each time the power amplifier means is keyed, the signal opposing the direction of keying; and (b) means to limit the effect of the feedback signal to moments of keying "on" and keying "off" of the power amplifier means whereby the leading and trailing edges of the output pulses are made trapezoidal and the amplitudes thereof between edges remains constant at saturation level for all output pulse widths corresponding with intermediate input signal amplitudes which differ substantially from those approaching zero and maximum.

4. An amplifier system comprising:

(a) generator means for delivering a constant train of high-frequency alternating carrier pulses;

(b) means for receiving an input signal including a range of lower frequencies to be amplified;

(c) a power amplifier;

(d) filter means connected with the power amplifier for eliminating said carrier frequency;

(e) a modulator connected to said receiving means to receive an input signal and connected to said generator means to receive carrier pulses, and connected to deliver output pulses to drive said power amplifier to saturation when there is a substantial input signal, the modulator including means for modulating the duration of either the positive or the negative pulses from the train to provide output pulses whose polarity depends upon the instantaneous input signal polarity and whose width is a function of the instantaneous input signal amplitude;

(f) negative feedback means connected operatively across the modulator and including means to adjust the feedback to a magnitude sufficient to make the output pulses trapezoidal by making their leading and trailing edges rise convergently for the full amplitude of the pulse but over a width which represents only a small portion of each half cycle of said generator means, whereby as the input signal amplitude decreases and approaches zero, the output pulses first decrease in width and then also shrink in amplitude; and (g) means to limt the amplitude of said feedback to a level at which the output pulses of one polarity reach maximum amplitude just as the output pulses of the other polarity reach zero amplitude as the polarity of the input signal reverses.

5. In an amplifier system as set forth in claim 4, another degenerative feedback path connected between the output of the power amplifier and the input to the signal receiving means for improving the linearity of the over-all system.

6. In an amplifier system as set forth in claim 4, regenerative feedback path means connected operatively across the modulator and serving to steepen the pulse response thereof when the effect of the limited negative feedback means has been dissipated.

7. An amplifier system including (a) input means to receive a signal to be amplified;

(b) a source of square waves of constant frequency;

(c) two separate pulse-width modulator means each connected to receive said square waves and said input signal and each to deliver in the absence of an input signal very narrow pulses on alternate square-wave half cycles, one modulator means being connected to increase at its output the length of its pulses during associated half cycles of the square wave when the input signal has one instantaneous polarity and in proportion to its amplitude, and the other modulator means being connected to increase at its output the lengh of its pulses during opposite half cycles of the square wave when the input signal has the opposite polarity and in proportion to its amplitude;

(d) normally-cut-off separate power amplifier means each connected to one of said outputs to receive said pulses and be driven to saturation thereby when there is a substantial input signal;

(e) push-pull connected output means coupled to said amplifier means and including means for filtering out said square wave frequency; and (f) negative feedback means connected operatively across said modulator means for feeding back degenerative components of the modulator means outputs, and said feedback means including means for limiting the feedback to a maximum value which is capable of limiting the modulator outputs to pulse amplitudes insufficient to drive the power amplifier means to saturation at instants when the input signal amplitude approaches zero.

8. In a system as set forth in claim 7, each modulator means including "on-off" pulse amplifying means having a control element connected to receive an input signal for changing the amplifier means from a stable state to an astable state; means for converting said square waves into an interlaced pair of sawtooth waves connected to the control element of the respective amplifying means, the leading edges of the sawtooth waves alternately biasing the amplifying means to astable state, and the input signals adding to the decaying sawtooth waves to determine how long the amplifying means remain in astable state; and means coupling the amplifying means to the respective power amplifier means to turn the latter "on" while the former is in astable state.

9. In an amplifier system as set forth in claim 7, another degenerative feedback path connected between the output of the power amplifier and the input to the signal receiving means for improving the linearity of the over-all system.

10. In an amplifier system as set forth in claim 7, regenerative feedback path means connected operatively across the modulator and serving to steepen the pulse response thereof when the effect of the limited negative feedback means has been dissipated.

11. An amplifier system comprising:
(a) generator means for delivering a constant train of high-frequency alternating carrier pulses;
(b) means for receiving and delivering at different terminals phase-split components of said input signal including a range of substantially lower frequencies to be amplified;
(c) a push-pull power amplifier;
(d) separate pulse-width modulator means respectively connected to different terminals to receive said input signal components and to receive carrier pulses, and to deliver output pulses modulated in width as a function of input signal component amplitude to drive the power amplifier, each modulator comprising a two-state semiconductor amplifying means operating as an "on-off" switch and normally biased to one conductivity state but driven by the combined input signal component and the applied carried pulse to the opposite conductivity state; and
(e) means connected to said generator means for converting the alternating carrier pulses into two time-interlaced sawtooth trains respectively connected to the pair of amplifying means to drive one of them at a time toward the said opposite conductivity state at the begnning of a sawtooth and to permit it to return to its normal state when the sawtooth has decayed only very slighly in amplitude, the input signal component to one amplifying means instantaneously bucking the effect of the sawtooth applied thereto and the input signal component in the other amplifier means augmenting the effect of the applied sawtooth.

12. In a amplifier system as set forth in claim 11, another degenerative feedback path connected between the output of the power amplifier and the input to the signal receiving means for improving the linearity of the overall system.

13. In an amplifier system as set forth in claim 12, regenerative feedback path means connected operatively across the modulator and serving to steepen the pulse response thereof.

14. An amplifier system including
(a) phase splitting means to receive a signal to be amplifier and including amplifiers to deliver opposed signal components;
(b) a source of square waves of constant frequency and symmetrical about a zero axis;
(c) means to convert the square waves into alternate time-interlaced decreasing sawtooth waves;
(d) two separate pulse-width modulator means each connected to receive a sawtooth wave and to receive an input signal component and to deliver a pulse for each sawtooth wave, the modulator means each comprising an "on-off" amplifying means having a normal conductivity state and being driven to astable conductivity state to deliver a very narrow pulse in the absence of a substantial input signal, one modulator means being driven to increase its output pulse when turned on by a sawtooth wave if the input signal component to it has an instantaneous polarity which adds to the sawtooth wave, and the other modulator means being driven to decrease and/or lose its output pulse when the oppositely-phased input component to its subtracts from the sawtooth wave applied to it;
(e) normally cut-off separate power amplifier means each comprising semiconductor amplifiers connected to one of said outputs to receive and be turned "on" by pulses therefrom when the associated modulator means is in said astable state;
(f) push-pull-connected output means coupled to said power amplifier means and including means for filtering out said square wave frequency; and (g) negative feedback means connected operatively across said modulator means between said power amplifier means and said phase splitter amplifiers for feeding back a degenerative component of the modulator means outputs, and said feedback means including a resistance connected to the phase splitter amplifiers and affecting their bias by a predetermined amount; a transistor connected across the resistance for short-circuting it when the transistor is conductive, the transistor having a normal conductivity state; and means connecting the transistor to the power amplifier means to reverse its conductivity state whenever the amplifier means is turned "on" thereby to provide feebdack limited in degree by said predetermined amount.

15. In an amplifier system as set forth in claim 14, another degenerative feedback path connected between the output of the power amplifier means and the input to the phase splitting means, for improving the linearity of the overall system.

16. In an amplifier system as set forth in claim 14, regenerative feedback path means connected operatively across the modulator means between the power amplifier means and the phase splitter amplifiers and steepening the pulse response of the modulator means and operating in opposition to said limited negative feedback means.

17. In an amplifier system as set forth in claim 14, said modulator means comprising transistors biased to saturation and direct-coupled to the power amplifier means to maintain them normally non-conductive, the sawtooth waves having a steep front and a peak value sufficient to cut-off the modulator means briefly while the sawtooth decays, and means coupling an input component to each modulator transistor so as to add that component to the applied sawtooth wave.

18. In a system as set forth in claim 14, said coupling means comprising resistors direct-coupling the input signal amplifiers to the modulator transistors, the internal resistances of the amplifiers and the modulator transistors when taken with said resistors forming a voltage divider normally biasing the transistors to draw saturation current, and said square-wave converting means being direct-coupled to said resistors to add to or to buck the amplified input signal components applied to the modulator transistors.

19. In an amplifier system as set forth in claim 14, said modulator means comprising transistors biased to cut-off and direct-coupled to the power amplifier means to maintain them non-conductive, the sawtooth waves having a steep front and a peak value sufficient to render the modulator briefly conductive while the sawtooth decays, and means coupling an input component to each modulator transistor so as to add that component to the applied sawtooth wave.

20. In a system as set forth in claim 19, said coupling means comprising resistors direct-coupling the input signal amplifiers to the modulator transistors, the internal resistances of the amplifiers and the modulator transistors when taken with said resistors forming a voltage divider normally biasing the transistors non-conductive, and said square wave converting means being direct-coupled to said resistors to add to or to buck the amplified input signal components applied to the modulator transistors.

References Cited

UNITED STATES PATENTS

| | | | |
|---|---|---|---|
| 2,491,969 | 12/1949 | Gloess | 332—9 |
| 3,090,929 | 5/1963 | Thompson | 332—9 |
| 3,225,216 | 12/1965 | Grabowski. | |

ROY LAKE, *Primary Examiner.*

ALFRED L. BRODY, *Examiner.*